United States Patent
Lee et al.

(10) Patent No.: US 8,958,498 B1
(45) Date of Patent: Feb. 17, 2015

(54) METHOD OF GENERATING DRIVING SIGNAL FOR DRIVING DUAL MODE SUPPLY MODULATOR FOR POWER AMPLIFIER AND DEVICE THEREOF

(71) Applicants: Sung Jun Lee, Daejeon (KR); Jae Ho Jung, Daejeon (KR); Kwangchun Lee, Daejeon (KR)

(72) Inventors: Sung Jun Lee, Daejeon (KR); Jae Ho Jung, Daejeon (KR); Kwangchun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/267,262

(22) Filed: May 1, 2014

(30) Foreign Application Priority Data

Sep. 12, 2013 (KR) ........................ 10-2013-0109874

(51) Int. Cl.
*H04L 25/34* (2006.01)
*H04L 25/49* (2006.01)

(52) U.S. Cl.
CPC .................................. *H04L 25/4917* (2013.01)
USPC ........... 375/286; 375/295; 375/297; 375/302; 332/103

(58) Field of Classification Search
USPC ................... 375/286, 295, 297, 302; 332/103
See application file for complete search history.

(56) References Cited

U.S. PATENT DOCUMENTS

| | | | |
|---|---|---|---|
| 8,391,406 B2 | 3/2013 | Kim et al. | |
| 8,681,898 B2* | 3/2014 | Kim et al. | 375/302 |
| 2014/0022102 A1* | 1/2014 | Cho et al. | 341/120 |

FOREIGN PATENT DOCUMENTS

KR 10-2010-0069126 A 6/2010

OTHER PUBLICATIONS

Kim, J. H., Lee, S. J., Jung, J. H., & Park, C. S. "60% High-Efficiency 3G LTE Power Amplifier with Three-level Delta Sigma Modulation Assisted by Dual Supply Injection" In *Microwave Symposium Digest (MTT)*, Jun. 2011 IEEE MTT-S International (pp. 1-4).

* cited by examiner

*Primary Examiner* — Ted Wang
(74) *Attorney, Agent, or Firm* — NSIP Law

(57) ABSTRACT

Provided is a method of generating a driving signal for driving a dual mode supply modulator for a power amplifier. The method includes obtaining an envelope of a complex baseband signal to be transmitted, comparing the envelope of the complex signal with a preset threshold value, when a current envelope of the complex signal is the preset threshold value or greater or when there is a result having the preset threshold value or greater in previous N comparisons, outputting a digital board output signal configured with a first logic level through a digital-to-analog converter; and when the current envelope of the complex signal is smaller than the preset threshold value and when there is no result having the preset threshold value or greater in the previous N comparisons, outputting a digital board output signal configured with a second logic level through the digital-to-analog converter.

13 Claims, 5 Drawing Sheets

US 8,958,498 B1

METHOD OF GENERATING DRIVING SIGNAL FOR DRIVING DUAL MODE SUPPLY MODULATOR FOR POWER AMPLIFIER AND DEVICE THEREOF

CROSS-REFERENCE TO RELATED APPLICATIONS

This U.S. non-provisional patent application claims priority under 35 U.S.C. §119 of Korean Patent Application No. 10-2013-0109874, filed on Sep. 12, 2013, the entire contents of which are hereby incorporated by reference.

BACKGROUND OF THE INVENTION

The present invention disclosed herein relates to a technology for providing a supply voltage to a power amplifier and, more particularly, to a method of generating a driving signal for driving a dual mode supply modulator for a power amplifier in a transmission structure of a 3-level envelope delta-sigma modulator (EDSM).

Modern communication standards such as IEEE 802.16 and $3^{rd}$ generation partnership project (3GPP) long term evolution (LTE) use a complex modulation scheme for obtaining a high data rate in limited frequency resources. Due to this, a transmission signal has a high peak-to-average power ratio (PAPR), which results in an unfavorable condition in efficiency performance Since current base station system aims miniaturization, a higher efficient power amplifier structure is necessary than any other time.

An envelope elimination and restoration (EER) transmission structure is one of high efficiency power amplifier structures and has a structure of separating envelope and phase components, processing them respectively, and recombining them.

Typically, an EER structure means a Kahn structure, but all structures for separating envelope and phase components of a signal and processing them, such as an improved Kahn structure or a digital polar modulator (DPM) structure, may be called as the EER structure.

Among the EER structure, a structure for applying a delta-sigma modulator (DSM) to an envelope component is particularly called as an envelope delta-sigma modulator (EDSM) structure.

In a three-level EDSM transmission structure, when a power amplifier is configured with a single transistor, dual supply voltages are necessary for the high efficient operation of the power amplifier.

For this, a dual mode supply modulator which provides dual supply voltages according to a driving signal is used, and the function thereof is to provide dual supply voltages ('VDD low' and 'VDD high') according to a driving signal of two levels (VL, VH). That is, when the driving signal is VL, the dual mode supply modulator provides VDD low, and when the driving signal is VH, it provides VDD high. Accordingly, in order to provide the dual supply voltages to the power amplifier properly, it is necessary to form the signal for driving the dual mode supply modulator properly.

SUMMARY OF THE INVENTION

The present invention provides a method of generating a driving signal for driving a dual mode supply modulator for providing dual supply voltages in a three-level EDSM transmission structure and a device thereof.

Embodiments of the present invention provide methods of generating a driving signal for driving a dual mode supply modulator which provides dual supply voltages to a power amplifier, the methods including: obtaining an envelope of a complex baseband signal to be transmitted; comparing the envelope of the complex signal with a preset threshold value; when a current envelope of the complex signal is the preset threshold value or greater or when there is a result having the preset threshold value or greater in previous N (where N is zero or a positive integer) comparisons, outputting a digital board output signal configured with a first logic level through a digital-to-analog converter; and when the current envelope of the complex signal is smaller than the preset threshold value and when there is no result having the preset threshold value or greater in the previous N comparisons, outputting a digital board output signal configured with a second logic level through the digital-to-analog converter.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
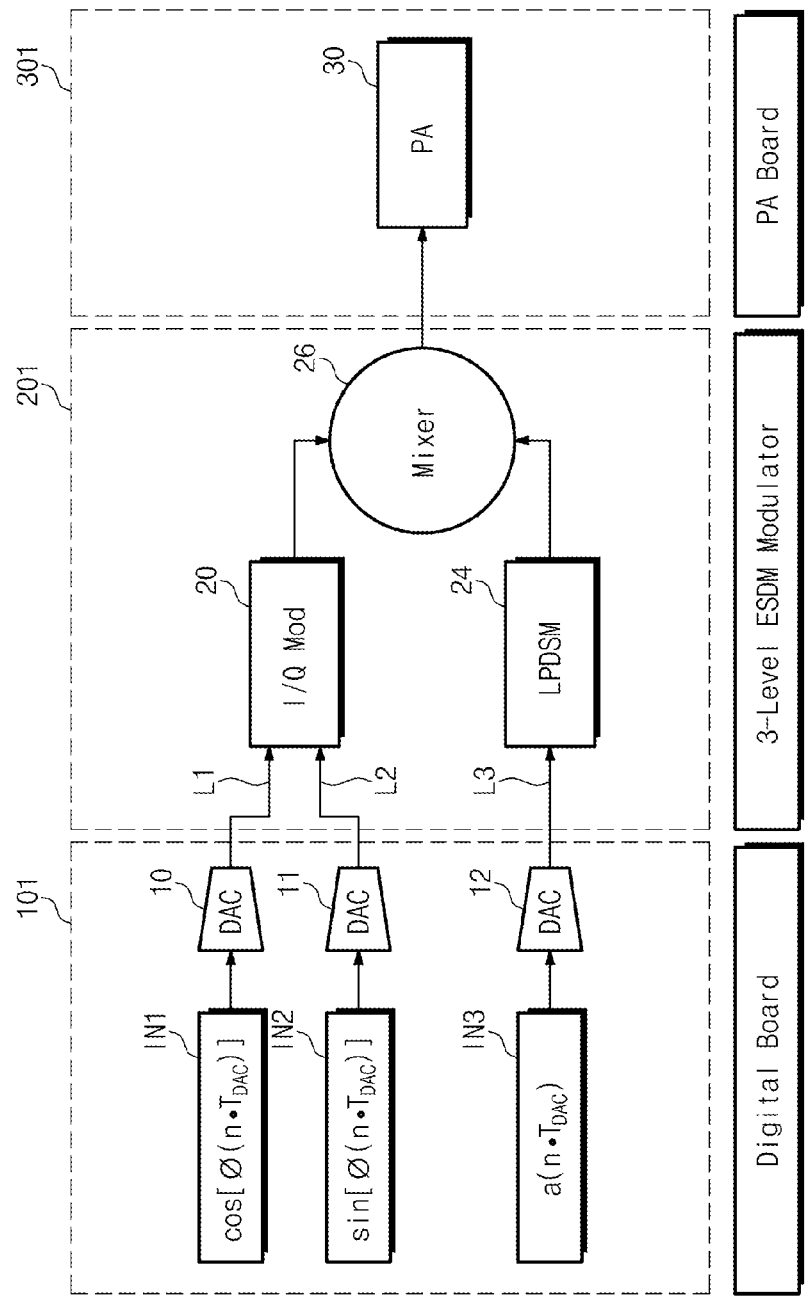
FIG. 1 illustrates a structure of a three-level envelope delta-sigma modulator (EDSM) transmitter which employs a power amplifier using a single supply voltage.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the present embodiment of the present invention, if certain devices or lines are described as being connected to a target device block, they are not only directly connected to the target device block, but also connected to the target device block by means of any other device.

Also, the same or similar reference numerals provided in each drawing denote the same or similar components. In some drawings, connection relations between devices and lines are merely shown for efficient description of the technical spirit, and therefore other devices or circuit blocks may be further provided.

Exemplary embodiments set forth herein may include complementary embodiments thereof, and it will be noted that a general operation of a modulator or a converter element, which converts a digital signal into an analog signal, is not described in detail so as not to obscure the essential point of the embodiment of the present invention.

Hereinafter, it will be described about an exemplary embodiment of the present invention in conjunction with the accompanying drawings.

Figure 2:
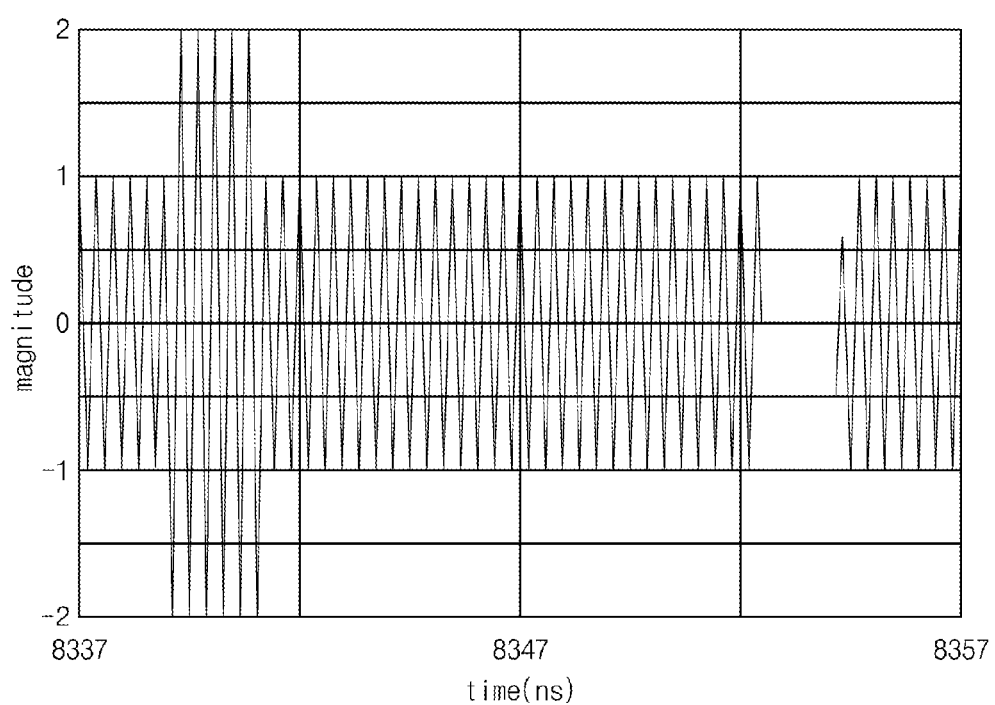
FIG. 2 is an exemplary waveform of an input signal of the power amplifier in FIG. 1.
Figure 3:
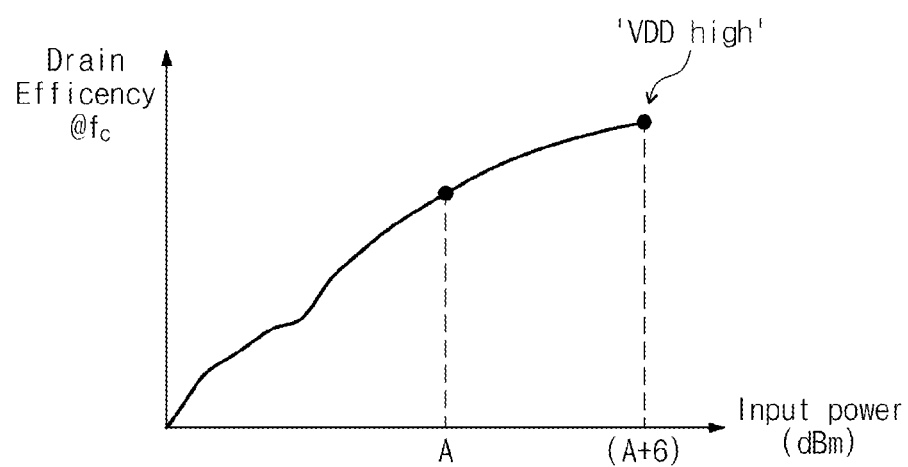
FIG. 3 is exemplary power amplification efficiency in relation to FIG. 1.

FIG. 1 illustrates a structure of a three-level envelope delta-sigma modulator (EDSM) which employs a power amplifier using a single supply voltage. Also, FIG. 2 is an exemplary waveform of an input signal of the power amplifier in FIG. 1 and FIG. 3 is exemplary power amplification efficiency in relation to FIG. 1.

Referring to FIG. 1, a power amplification system consists of a digital board 101 including a plurality of digital-to-analog converters (DACs) 10, 11, and 12, a modulation unit 201 including an In-phase/Quadrature phase (I/Q) modulator 20, a low pass delta-sigma modulator (LPDSM) 24, and a mixer 26, and a power amplifier board 301 including a power amplifier 30. Here, operations of the digital board 101 and the modulation board 201 are identical with or similar to those of any three-EDSM transmission structure.

A complex baseband signal $c(n \cdot T_{DAC})$ to be transmitted can be separated into an envelope component $a(n \cdot T_{DAC})$ and a phase component $\phi(n \cdot T_{DAC})$. Here, $T_{DAC}$ means a reciprocal of an operation speed of a DAC.

When the envelope component $a(n \cdot T_{DAC})$ and phase component related $\cos [\phi(n \cdot T_{DAC})]$ and $\sin [\phi(n \cdot T_{DAC})]$ pass through the corresponding DACs 10, 11, and 12, analog signals $a(t)$, $\cos [\phi(t)]$ and $\sin [\phi(t)]$ appear respectively at output lines L3, L1, and L2 by means of conversion functions of the DACs 10, 11 and 12.

An output $m(t)$ of the LPDSM 24 for the envelope signal $a(t)$ can be expressed as Equation (2), and an output $up(t)$ of the I/Q modulator 20 for the phase component related signals $\cos [\phi(t)]$ and $\sin [\phi(t)]$ can be expressed as Equation (3). In the following equations, $e(t)$ denotes a shaped quantization noise of the LPDSM 24, and $f_c$ denotes a carrier frequency.

$$c(n \cdot T_{DAC}) = a(n \cdot T_{DAC}) \cdot \exp(j \cdot \phi(n \cdot T_{DAC})) \quad (1)$$

$$m(t) = (a(t) + e(t)) \quad (2)$$

$$up(t) = \cos(2\pi f_c t + \phi(t)) \quad (3)$$

The restoration mixer 26 recombines $m(t)$ and $up(t)$ to generate an output $d(t)$ of the modulating unit 201, which drives the power amplifier 30. The output $d(t)$ can be expressed as Equation (4).

$$d(t) = (a(t) + e(t)) \cdot \cos(2\pi f_c t + \phi(t)) \quad (4)$$

An input signal of the power amplifier 30, which is defined as Equation (4) and have an envelope of '0', '1', or '2' as shown in FIG. 2. That is, the input signal driving the power amplifier 30 is a sinusoidal wave whose amplitude is one of '0', '1', and '2' at each moment. Here, a frequency of the sinusoidal wave corresponds to $f_c$.

When the power amplifier 30 is configured with a single transistor and a fixed supply voltage is used, an input having an amplitude of '1' may become an issue as shown in FIG. 3. That is, while being driven by an input having an amplitude of '1', the power amplifier 30 operates greatly deviated from a maximum efficiency value. Here, it will be noted that the single transistor may include a case where a plurality of transistors are combined and used as a single transistor to output higher power.

In FIG. 3, a horizontal axis denotes input power having dBm unit, a vertical axis denotes drain efficiency of the power amplifier for a sinusoidal wave of $f_c$. In FIG. 3, point A denotes power corresponding to amplitude '1', and point (A+6) denotes power corresponding to amplitude '2'.

Figure 4:
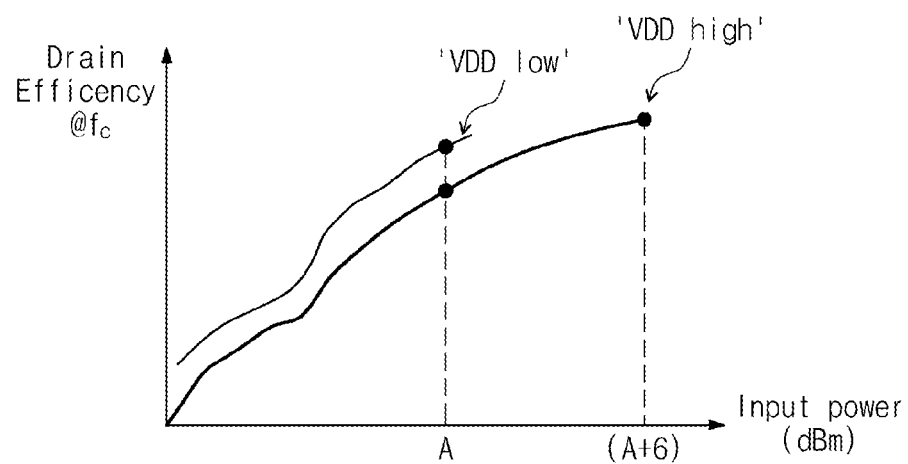
FIG. 4 is an exemplary diagram illustrating power amplification efficiency for a case where dual supply voltages are used.

FIG. 4 is exemplary power amplification efficiency in case where dual supply voltages are used.

Contrary to FIG. 3, in order to obtain high efficiency, while an input having an amplitude of '1' drives the power amplifier, it is necessary to lower a supply voltage used by the power amplifier so that the power amplifier may operate in proximity of the maximum efficiency value even for an input having an amplitude of '1' as shown in FIG. 4. That is, for the input having an amplitude of '1', the supply voltage of 'VDD low' is to be provided, and for the input having an amplitude of '2', the supply voltage of 'VDD high' is to be provided.

For this, it can be considered that, separately from an output applied to the restoration mixer 26 from the LPDSM 24, an output may be designed to be output to the outside to drive the dual mode supply modulator 32. That is, when the LPDSM 24 outputs '0' or '1', the dual mode supply modulator 32 outputs 'VDD low', and, when the LPDSM 24 outputs '2', the dual mode supply modulator 32 outputs 'VDD high'. However, in this case, it is necessary that the dual mode supply modulator 32 follows an output change of the LPDSM 24 that operates at hundreds MHz. But this tracking operation is not easy to realize.

Accordingly, pulse shaping is necessary for outputting 'VH' (instructs 'VDD high') in a corresponding period, when an output of the LPDSM 24 is scanned by a window having a constant length and even one '2' exists within the window. In this case, since 'VDD high' may be provided with respect to an input of the power amplifier having an amplitude of '0' or '1', efficiency may be less improved, compared to a case where a dual mode supply modulator ideally follows the output of the LPDSM 24. However, in case of the pulse shaping, it is highly possible that the dual mode supply modulator 32 easily follows the output change. That is, this pulse shaping is to obtain efficiency improvement through use of the dual supply voltages in a realizable range.

Also, this pulse shaping does not allow 'VDD low' to be applied during the input having an amplitude of '2' drives the power amplifier. It is described below in detail.

For the input having an amplitude of '1', efficiency is higher in a case where 'VDD low' is applied as the supply voltage than a case where 'VDD high' is applied. The reason is that the power amplifier is saturated earlier by reducing the supply voltage. That is, when 'VDD low' is applied as a supply voltage, an input having an amplitude of '1' corresponds to a condition of saturating the power amplifier and the power amplifier may have high efficiency. However, since the power amplifier is saturated at an input having an amplitude of '1', an amplitude of the output of the power amplifier for an input having an amplitude of '2' is similar to the output of the power amplifier for an input having an amplitude of '1'. This means that the amplitude ratio of 2 in an input leads to the amplitude ratio of 1 in an output, which results in degradation of signal quality.

However, it is impossible to implement the real-time pulse shaping function using an output of the LPDSM as an input. The reason is that a non-causal system does not exist.

Figure 5:
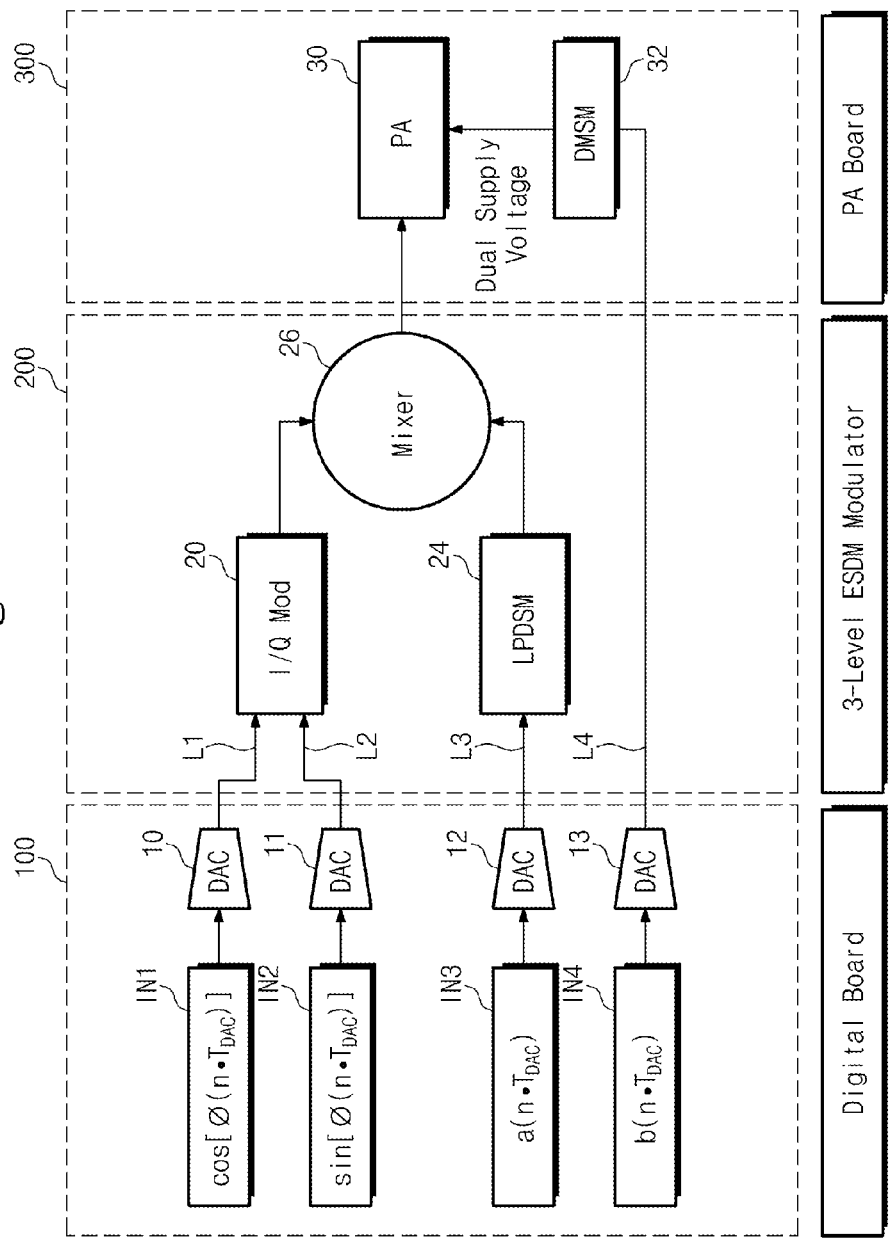
FIG. 5 illustrates a structure of a three-level EDSM transmitter which employs a power amplifier using dual supply voltages according to an embodiment of the present invention.
Figure 6:
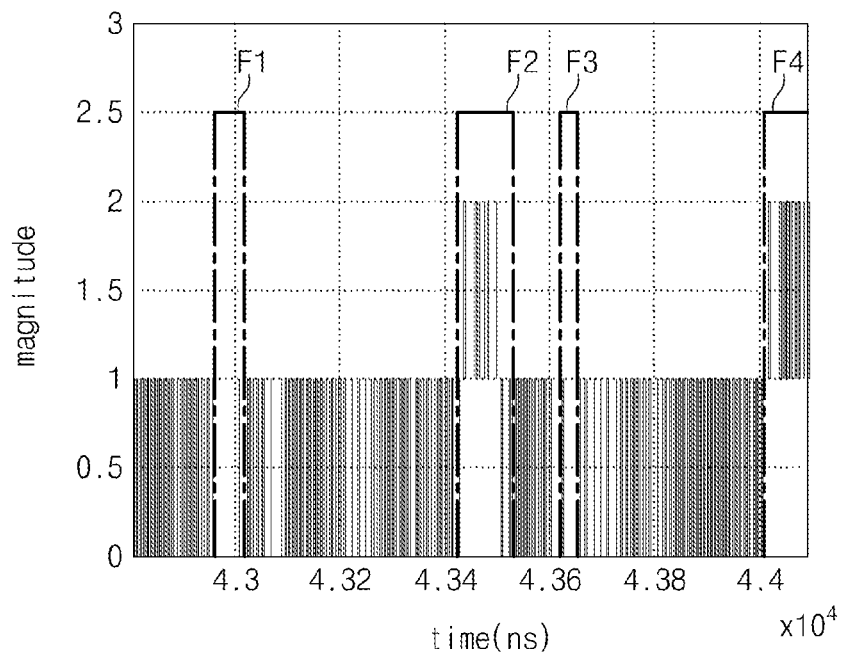
FIG. 6 is an exemplary diagram illustrating a waveform in narrow range confirmation in relation to FIG. 5.
Figure 7:
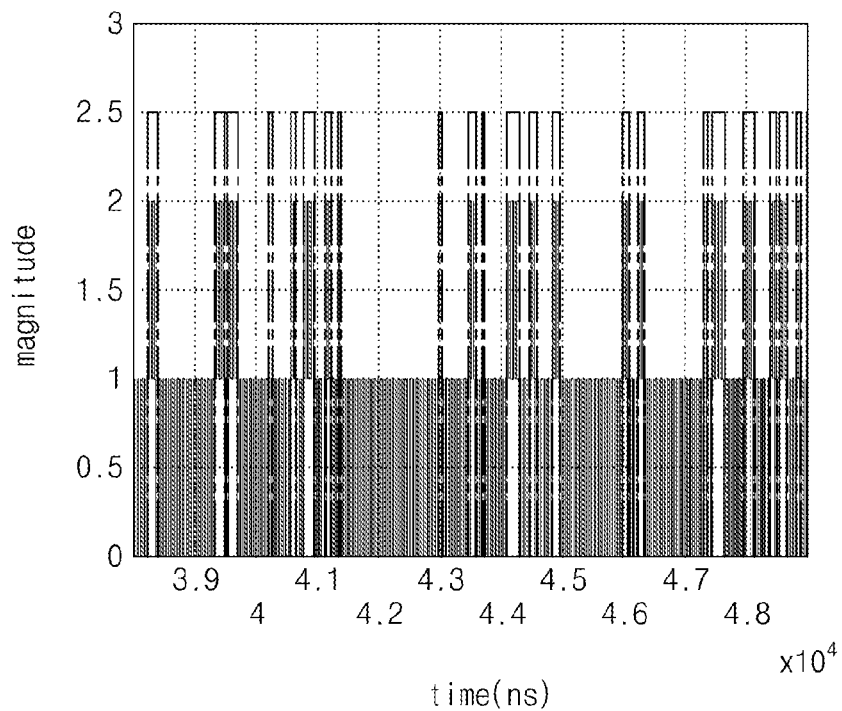
FIG. 7 is an exemplary diagram illustrating a waveform in wide range confirmation in relation to FIG. 5.

FIG. 5 illustrates a structure of a three-level EDSM transmitter which employs a power amplifier using dual supply voltages according to an embodiment of the present invention. Also, FIGS. 6 and 7 are exemplary waveforms of an output signal of the LPDSM and a driving signal of the dual mode supply modulator.

Referring to FIG. 5, the power amplifying system consists of a digital board 100 including a plurality of DACs 10, 11, 12, and 13, a modulating unit 200 including an I/O modulator 20, an LPDSM 24, and a mixer 26, and a power amplifier board 300 including a power amplifier 30 and a dual mode supply modulator 32. Here, operations of the digital board 100 and the modulating unit 200 are almost similar to those of the digital board 101 and the modulating unit 201, and, Equations (1) to (4) are used for description in relation to them. The digital board 100 converts an envelope component $a(n \cdot T_{DAC})$ and phase component related $\cos [\phi(n \cdot T_{DAC})]$ and $\sin [\phi(n \cdot T_{DAC})]$ of a complex baseband signal $c(n \cdot T_{DAC})$ to be transmitted into analog signals $a(t)$, $\cos [\phi(t)]$ and $\sin [\phi(t)]$ through the DACs 10, 11, and 12, and output them to the modulating unit 200. The digital board output signals may be generated by a field programmable gate array (FPGA) or an ASIC.

The modulating unit 200 includes the I/Q modulator 20 receiving the phase component related signals $\cos [\phi(t)]$ and $\sin [\phi(t)]$ to modulate them, the LPDSM 24 receiving the envelope signal $a(t)$ to modulate it, and the mixer 26 mixing outputs of the I/Q modulator 20 and the LPDSM 24.

The power amplifier board 300 includes the power amplifier 30 receiving an output of the mixer 26 and the dual mode supply modulator 32 supplying dual supply voltages to the power amplifier 30.

The digital board 100 of FIG. 5 compares an envelope of the complex baseband signal with a preset threshold value and determines an output thereof from a current comparison result and previous N comparison results. That is, when a current envelope of the complex signal is the preset threshold value or greater or when there is a result having the preset threshold value or greater in previous N (where N is zero or a positive integer), a first logic level (e.g. high level, VH) is output through the DAC 13. Alternatively, when the current envelope of the complex signal is smaller than the preset threshold value and when there is no result having the preset threshold value or greater in the previous N comparisons, a second logic level (e.g. low level, VL) is output through the DAC 13.

That is, in the embodiment, a signal for driving the dual mode supply modulator 32 is result of applying an algorithm described as Equation (5) in the digital board 100 of a structure shown in FIG. 5. This is based on an assumption that there is correlation between an input and output of a low pass delta-sigma modulator, and thus, when the envelope of the complex signal is large, it is highly possible that an output of the LPDSM 24 is '2'.

It is described in detail as follows. When a current envelope $a(n \cdot T_{DAC})$ of the complex signal appearing in a signal input IN3 is the preset threshold voltage '$V_{TH}$' or greater, or when there is a value among previous N envelopes $a((n-1) \cdot T_{DAC}), \ldots, a((n-N) \cdot T_{DAC})$, which is the preset threshold voltage '$V_{TH}$' or greater, $b(n \cdot T_{DAC})$ appearing in a signal input IN4 driving the current dual mode supply modulator 32 is set as VH (instruct 'VDD high') to be output through the DAC 13 in the digital board 100.

On the contrary, when the current envelope $a(n \cdot T_{DAC})$ of the complex signal appearing in a signal input IN3 is smaller than the preset threshold voltage '$V_{TH}$' and when there is not a value among previous N envelopes $a((n-1) \cdot T_{DAC}), \ldots, a((n-N) \cdot T_{DAC})$, which is the preset threshold voltage '$V_{TH}$' or greater, $b(n \cdot T_{DAC})$ appearing in a signal input IN4 driving the current dual mode supply modulator 32 is set as VL (instruct 'VDD low') to be output through the DAC 13 in the digital board 100.

$$b(n \cdot T_{DAC}) = \{_{VL, otherwise}^{VH, if\ a(k \cdot T_{DAC}) \geq V_{TH}(n-N \leq k \leq n)} \quad (5)$$

Table 1 below shows a simulated result that an implementation scheme according to the embodiment is applied. In the simulation, an LTE signal having about 10 MHz bandwidth using 64-quadrature amplitude modulation (QAM) is assumed to be a baseband signal. This baseband signal has PAPR of about 8.5 dB by application of crest factor reduction (CFR) algorithm and is configured with 5 orthogonal frequency-division multiplexing (ODFM) symbols using extended cyclic prefix (CP). A DAC operation speed and an LPDSM operation speed are assumed to be 122.88 MHz and 522.24 MHz, respectively.

In the algorithm described as Equation (5), for $a(n \cdot T_{DAC})$ having a range of 0 to 2, the threshold voltage '$V_{TH}$' is set to 0.95 and 'N' is set to 3. Also, a circuit parameter of the LPDSM, 'Hinf (out of band gain)', is set to 1.5.

TABLE 1

| $V_{TH}$ = 0.95, (0 ≤ a (n · $T_{DAC}$) ≤ 2), N = 3 | | |
|---|---|---|
| Amplitude of input signal of power amplifier (= output of | Output of digital board b(t) | |
| LPDSM @ Hinf = 1.5) | VH | VL |
| '2' | 8540 | 0 |
| '1' | 42421 | 80936 |
| '0' | 2507 | 83196 |
| Check | 217600 | |

A result of Table 1 is to confirm, at a speed 522.24 MHz, a value of an analog output b(t) appearing by passing the sample-and-hold (S&H) DAC 13. That is, every time an output of the LPDSM 24 is generated, the value of b(t) is confirmed. Since the number of samples is 43,520 when one OFDM symbol having an extended CP is interpolated at 522.24 MHz, the number of samples of 5 OFDM symbols becomes 217,600 (=43,520*5). As shown here, when a amplitude of the input signal of the power amplifier 30 is '2', the DAC 13 in the digital board 100 outputs VH (instruct 'VDD high') to drive the dual mode supply modulator 32. Also, when the amplitude of the input signal of the power amplifier 30 is '0' or '1', the digital board 100 outputs VL (instruct 'VDD low') more frequently than VH (instruct 'VDD high') through DAC 13 to help to improve the efficiency of the power amplifier 30.

In FIGS. 6 and 7, an output waveform of the LPDSM 24 and a waveform of signal b(t) driving the dual mode supply modulator 32 are represented together. In FIGS. 6 and 7, an alternated long and short dash line indicates a waveform of signal b(t). In FIG. 6, waveforms F1 to F4 represent waveforms of signal b(t).

As confirmed in Table 1 and FIGS. 6 and 7, the method of the present embodiment of the present invention according to the configuration of FIG. 5, performs the pulse shaping function like as the above-described pulse shaping function that when an output of the LPDSM is scanned by using a window having a constant length and even one '2' exists in the window, VH (instruct 'VDD high') is output in the corresponding period.

In addition, the method according to the embodiment of the present invention may be easily implemented such that the algorithm of Equation (5) is applied at a driving speed (122.88 MHz in the above-described) of DAC in the digital board.

Table 2 below shows a result that the method according to the embodiment of the present invention is applied, while the circuit parameter 'Hinf' of the LPDSM is changed with the rest conditions maintained same as Table 1.

TABLE 2

| Amplitude of input signal of power amplifier (=output of LPDSM) | Output of digital board b(t) | | | | | |
|---|---|---|---|---|---|---|
| | Hinf = 1.5 | | Hinf = 2.0 | | Hinf = 2.5 | |
| | VH | VL | VH | VL | VJ | VL |
| '2' | 8540 | 0 | 10941 | 354 | 13466 | 1951 |
| '1' | 42421 | 80936 | 37401 | 80445 | 32278 | 77325 |
| '0' | 2507 | 83196 | 5126 | 83333 | 7724 | 84856 |
| check | 217600 | | 217600 | | 217600 | |

As the circuit parameter 'Hinf' increases, correlation between an input and output of a low pass delta-sigma modulator becomes reduced. Therefore, and a result of applying the embodiment of the present invention based on the correlationship differs from the intention. That is, even when the amplitude of the input signal of the power amplifier is '2', the number of times that VL (instruct 'VDD low') is output from the digital board 100 increases. Thus the signal quality becomes degraded, and this is not the effect of the intended pulse shaping.

Table 3 below represents results of an error vector magnitude (EVM) and an adjacent channel leakage ratio (ACLR) through baseband equivalent simulation. Here, it can be known that performance change according to a change of 'Hinf' is very small.

TABLE 3

| Hinf | EVM | ACLR (dB) | |
|---|---|---|---|
| | | Low | High |
| 1.5 | 2.9604 | 44.0050 | 43.9366 |
| 2.0 | 2.9256 | 44.3503 | 44.6735 |
| 2.5 | 2.9842 | 44.1213 | 44.0416 |

It is known from Tables 2 and 3 that it is not a limitation to restrict the circuit parameter 'Hinf (out of band gain)' of the LPDSM to a low value because the performance of the three-level EDSM does not affect by the 'Hinf'.

In the embodiment of the present invention, 'a structure and method for generating a driving signal for a dual mode supply modulator' is implemented by finally applying an algorithm of Equation (5) to a structure that is a three-level EDSM transmission structure of FIG. 5, which includes a power amplifier having a single transistor and has the circuit parameter 'Hinf (out of band gain) of the LPDSM restricted to a low value (e.g. 1.5). According to the embodiments of the present invention, a method and device for generating a driving signal of a dual mode supply modulator for a high efficiency three-level EDSM transmitter is provided. The method may have characteristics changed by adjusting algorithm parameters '$V_{TH}$' and 'N' in a digital board during operation.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of generating a driving signal for driving a dual mode supply modulator which provides dual supply voltages to a power amplifier, the method comprising:
    obtaining an envelope of a complex baseband signal to be transmitted;
    comparing the envelope of the complex signal with a preset threshold value;
    when a current envelope of the complex signal is the preset threshold value or greater or when there is a result having the preset threshold value or greater in previous N (where N is zero or a positive integer) comparisons, outputting a digital board output signal configured with a first logic level through a digital-to-analog converter; and
    when the current envelope of the complex signal is smaller than the preset threshold value and when there is no result having the preset threshold value or greater in the previous N comparisons, outputting a digital board output signal configured with a second logic level through the digital-to-analog converter.

2. The method of claim 1, wherein the digital board output signal configured with the first and second logic levels is applied to the dual mode supply modulator of a power amplifier board for driving the dual mode supply modulator.

3. The method of claim 2, wherein, the dual mode supply modulator provides VDD High voltage to the power amplifier while the digital board output signal configured with the first logic level is provided, and provides VDD Low voltage to the power amplifier while the digital board output signal configured with the second logic level is provided.

4. The method of claim 1, wherein characteristics of the method is changeable through adjustment of the threshold value and N during operation.

5. The method of claim 1, wherein the comparing of the envelope of the complex signal with the preset threshold value is performed at an operation speed of the digital-to-analog converter.

6. The method of claim 1, wherein a driving scheme of the dual mode supply modulator is applied to a three-level envelope delta-sigma modulator (EDSM) transmitter.

7. The method of claim 6, wherein the driving scheme of the dual mode supply modulator is applied when a circuit parameter of low pass delta-sigma modulator (LPDSM), 'Hinf', is low.

8. A structure for application of a method of generating a driving signal for driving a dual mode supply modulator providing dual supply voltages to a power amplifier, the structure comprising:
    a digital board obtaining an envelope of a complex baseband signal to be transmitted, comparing the envelope of the complex signal with a preset threshold value, when a current envelope of the complex signal is the preset threshold value or greater or when there is a result having the preset threshold value or greater in previous N (where N is zero or a positive integer) comparisons, outputting a digital board output signal configured with a first logic level through a digital-to-analog converter, and
    when the current envelope of the complex signal is smaller than the preset threshold value and when there is no a result having the preset threshold value or greater in the previous N comparisons, outputting a digital board output signal configured with a second logic level through the digital-to-analog converter; and the dual mode supply modulator providing dual supply voltages to the power supply according to a driving signal.

9. A device comprising:
a digital board comprising digital-to-analog converters respectively converting input signals separated from a complex baseband signal to be transmitted;
a modulating unit comprising a first modulator receiving outputs of the digital-to-analog converters, which are phase related signals, and modulating the received outputs, a second modulator receiving output of the digital-to-analog converter, which is an envelope signal, and modulating the received outputs, and a mixer mixing the outputs of the first and second modulators; and
a power amplifier board comprising a power amplifier receiving an output of the mixer and a dual mode supply modulator providing dual supply voltages to the power amplifier,
wherein the envelope of the complex signal is compared with a preset threshold value, when a current envelope of the complex signal is the preset threshold value or greater or when there is a result having the preset threshold value or greater in previous N (where N is zero or a positive integer) comparisons, a digital board output signal configured with a first logic level is output through the digital board, and, when the current envelope of the complex signal is smaller than the preset threshold value and when there is no result having the preset threshold value or greater in the previous N comparisons, a digital board output signal configured with a second logic level is output through the digital board.

10. The device of claim 9, wherein, the dual mode supply modulator provides VDD High voltage to the power amplifier while the digital board output signal configured with the first logic level is provided, and provides VDD Low voltage to the power amplifier while the digital board output signal configured with the second logic level is provided.

11. The device of claim 9, wherein the first modulator is I/Q modulator and the second modulator is a low pass delta-sigma modulator.

12. The device of claim 9, wherein the digital board output signals are generated by a field programmable gate array (FPGA) or an ASIC.

13. The device of claim 9, wherein the digital board output signals are generated by a microprocessor.

* * * * *